United States Patent [19]

Doo

[11] 4,153,988
[45] May 15, 1979

[54] HIGH PERFORMANCE INTEGRATED CIRCUIT SEMICONDUCTOR PACKAGE AND METHOD OF MAKING

[75] Inventor: Ven Y. Doo, Poughkeepsie, N.Y.

[73] Assignee: International Business Machines Corporation, Armonk, N.Y.

[21] Appl. No.: 815,951

[22] Filed: Jul. 15, 1977

[51] Int. Cl.² .............................................. H05K 3/30
[52] U.S. Cl. ........................................ 29/626; 361/401
[58] Field of Search ................... 29/626, 625, 25.42; 361/400, 401, 403, 397, 302, 306; 174/68.5

[56] References Cited

U.S. PATENT DOCUMENTS

| | | | |
|---|---|---|---|
| 3,049,647 | 8/1962 | Lincoln | 361/401 |
| 3,191,098 | 6/1965 | Fuller | 361/401 |
| 3,351,816 | 11/1967 | Sear et al. | 317/101 |
| 3,530,411 | 9/1970 | Sear | 174/68.5 X |
| 3,569,790 | 3/1971 | Jenik | 361/403 |
| 3,754,170 | 8/1973 | Tsuda et al. | 317/235 R |
| 3,808,478 | 4/1974 | Winkler | 361/302 |
| 3,922,479 | 11/1975 | Older et al. | 174/68.5 |
| 4,034,469 | 7/1977 | Koopman et al. | 29/626 |

OTHER PUBLICATIONS

Radovsky et al; "Through Hole Plating"; IBM Technical Disclosure Bulletin; vol. 3, No. 5, Oct., 1960.

Primary Examiner—Michael J. Keenan
Attorney, Agent, or Firm—Wolmar J. Stoffel

[57] ABSTRACT

A high performance package for integrated circuit semiconductor devices in which decoupling capacitors are provided in close proximity to the integrated circuit devices for reducing voltage variations in the power driver lines, and/or a ground plate overlying the stripe metallurgy on the surface of the substrate for reducing cross-talk between signal lines. The decoupling capacitors are each comprised of a conductive layer on the inside of a via hole, a concentric dielectric layer on the conductive layer, and an electrically conductive plug in physical contact with the dielectric layer that is associated with the driver line circuitry of the package.

16 Claims, 13 Drawing Figures

HIGH PERFORMANCE INTEGRATED CIRCUIT SEMICONDUCTOR PACKAGE AND METHOD OF MAKING

BACKGROUND OF THE INVENTION

This invention relates to integrated circuit semiconductor packages for forming a support for devices and electrical connections between an integrated circuit device and a board like structure, more specifically to a package having decreased driver noise and decreased cross-talk between signal lines.

Integrated circuit semiconductor devices have been developed to operate at increasingly higher operating speeds, particularly logic devices for computer applications. The increased frequency of the operating signals of the integrated circuit devices have required comparable improvements in the package structure as well. For example, cross-talk resulting from coupling between adjacent circuits of the signal lines becomes significant in high speed operation because of the rates of change in the electric and magnetic fields during transients. This problem becomes significant with the use of high frequency signals. Another significant problem is limiting voltage variations in the power driver lines, frequently referred to as driver noise. Since the amount of current used in the driver circuit lines is relatively high the driver noise is influenced primarily by the inductance in the lines. Decoupling capacitors have been proposed for reducing driver noise. However, conventional decoupling capacitors which are discrete and are necessarily located a distance from the device and normally require additional transmission lines which increase the inductance thereby reducing their effectiveness. At present with modern sophisticated integrated circuit semiconductor devices the package structure is frequently the limiting factor preventing the full and complete utilization of higher operating characteristics of semiconductor devices.

SUMMARY OF THE INVENTION

It is an object of this invention to provide a high performance package for integrated circuit semiconductor devices that incorporates structure for decreasing driver noise in the driver lines, and/or reduces cross-talk between the signal lines.

It is another object of this invention to provide a method for fabricating a high performance package for integrated circuit semiconductor devices which packages can be constructed utilizing conventional fabrication techniques.

In accordance with the foregoing objects of the present invention, a high performance package for semiconductor devices is set forth. The package includes a substrate of a dielectric material, a plurality of solder pads on the first side, at least one integrated circuit semiconductor device also having contact pads solder bonded to the solder pads on the substrate, a plurality of terminals on the opposite second side of the substrate adapted to be joined to a suitable board or other support, a metallurgy means electrically joining the solder pads on one side of the substrate to the terminals on the opposite second side, which means extends through holes in the substrate, the improvement comprising decoupling capacitors located internal to the substrate and associated with the metallurgy means, each of the decoupling capacitors formed of a first layer of metal located on the inside surface of selected holes in the substrate, a layer of dielectric material on the first layer of metal, a plug of conductive material within the hole and in physical contact with the layer of dielectric material with the plug constituting a portion of the metallurgy means electrically joining the solder pads to the terminals, and a means to provide a ground potential to the first layer of metal. The package can also include a ground plate on the first side of the substrate overlying the metallurgy stripes but in spaced relation thereto.

In the process for forming a high performanace package, a substrate of insulating material provided with a set of via holes is masked leaving exposed the holes in which decoupling capacitors are to be formed, depositing a thin layer of metal within the unmasked holes and on the surface interconnecting the holes, building up the thickness of initial layer of metal layer, anodizing the resultant metal layer thereby forming an overlying layer of dielectric material, filling in the holes with a conductive material, forming contact pads and terminal pads on the conductive plugs, and a ground terminal to the metal layer.

DETAILED DESCRIPTION OF THE INVENTION

Figure 1:
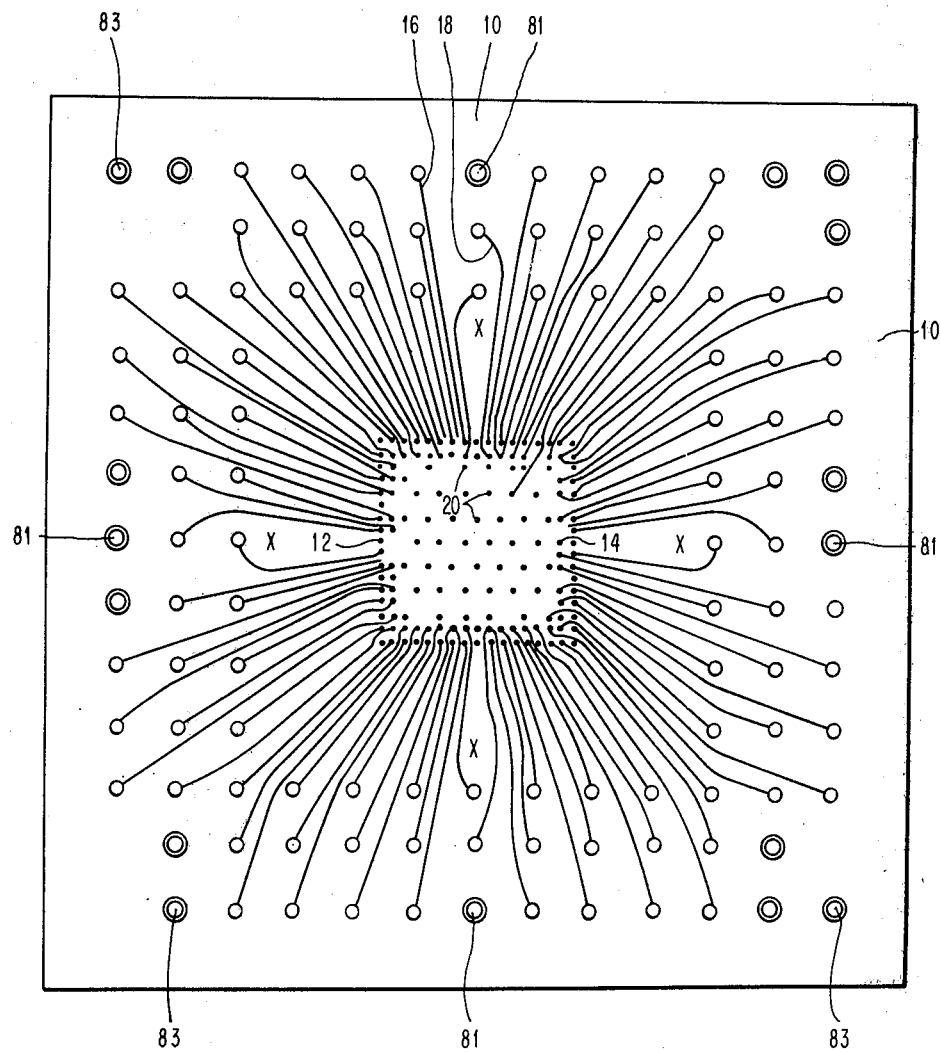
FIG. 1 is a top plan view of a preferred embodiment of the semiconductor package of the invention illustrated without an integrated circuit device bonded thereto.
Figure 2:
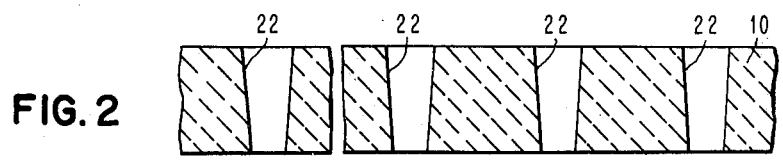
FIGS. 2, 3, 4, 5 and 6 is a series of elevational fragmentary views in broken section which illustrate the method steps required in order to fabricate the decoupling capacitor structure within the substrate in accordance with the method of the invention.

Referring now to the drawings, and FIG. 1 in particular, there is illustrated a top plan view of a preferred embodiment of the high performance package of the invention without the integrated circuit device bonded thereto. The package has a substrate 10 of ceramic material, preferaby with a coefficient of expansion that closely matches the coefficient of expansion of silicon. On the top surface there is provided a large number of solder pads arranged in a configuration that matches a configuration of terminal pads on the device to be bonded thereto. In general the outer rows 12 and 14 of the solder pads are for attachment to signal input/output terminals on the device. Metallurgy stripes 16 and 18, adhered to the surface of substrate 10 makes electrical contact to the input/output signal pads 12 and 14, respectively, and via plugs which extend through the substrate 10 to a terminal (not shown) on the bottom side. The precise number of input/output pads and their arrangement is a matter of design and can obviously be varied from the illustrated preferred embodiment. However, as will be explained it is preferable that the signal input/output pads be positioned around the outside periphery of the device. In the central portion of the pad area of the substrate 10 are provided pads 20 for attachment to the power and ground terminals of the device to be bonded to the substrate. In general these pads are more widely dispersed as illustrated in FIG. 1. Each of pads 20 are connected to an underlying via positioned in a hole in substrate 10 and connected to a terminal on the opposite lower side of the substrate. Located about the via pin underlying pad 20 is a decoupling capacitor which will be explained in greater detail in the discussion that follows.

The improved semiconductor package of the invention seeks to alleviate three significant problems associated with semiconductor packages in general thereby making the package more compatible with present highly sophisticated semiconductor devices, particularly devices developed for high speed computer logic operations. Further, the improved package of the invention can be fabricated using presently known processing techniques. A first problem in sophisticated packaging structures is signal propagation delay. The speed of large scale integrated circuits is limited to a great extent by package transmission delay. This is so since the switching delay of active devices becomes relatively insignificant with respect to the propagation delay in the large scale integration package. The propagation delay is due, to a great extent, to the large dielectric constant of the insulating material between the respective layers of the conventional package. The dielectric constant of insulating material is greater than one. The dielectric constant operating in a ceramic environment is on the order of nine. The higher the dielectric constant the lower the signal propagation speed. In this package, air isolation is used to isolate in part the metallurgy associated with the signal circuitry in the package. A second problem associated with conventional packaging structures is cross-talk between the signal lines. Cross-talk is caused between generally parallel signal lines by the inductive and capacitive coupling of the lines. In this semiconductor package a grounded plate in close proximity to and overlying the signal stripe metallurgy is provided to reduce the capacitive coupling of the neighboring lines. A third problem associated with semiconductor packages is reducing the driver noise, that is the voltage variation in the driver circuitry that is caused by inductance in the power supply metallurgy and wiring. In order to increase the speed of operation of a computing system it is highly desirable to have many drivers switching simultaneously. The constraining factor which limits the number of drivers that are operated simultaneously is driver noise. In this structure decoupling capacitors are provided in close proximity to the power supply terminals of the device. Driver noise, V, is controlled by the following relationship:

$$V = -nL(dI/dt)$$

where n is the number of the drivers switching simultaneously during the time interval of dt, where L is the inductance and dI/dt is the change of current with respect to time during switching. The dI/dt is set by the operating parameters of the device and cannot be significantly changed. However, the inductance L is a variable which, if reduced, will reduce the driver noise in accordance with the above expression. However the following expression is of interest, $$v^2 = (1/C\, L)$$

where v equals the velocity of light, L is inductance and C is capacitance. As the expression indicates, $C \times L$ is a constant. Therefore if C is made large, then L becomes small, which is desirable. Therefore the driver noise can be made smaller by increasing the capacitance of the power line. This capacitance can be increased by the use of decoupling capacitors associated with the metallurgy system of the package substrate.

Referring now to the drawings, FIGS. 2-9 in particular, there is illustrated the preferred method of fabricating the semiconductor package of the invention. A substrate 10 is formed of an insulating material, preferably a material having a coefficient of expansion that substantially matches the coefficient of expansion of silicon. Ceramic and glass-ceramic are the more conventional materials suitable for this purpose. The thickness of the substrate 10 is preferably on the order of 20-60 mils. Holes 22 are provided which are preferably tapered as illustrated. In general the holes 22 will have a diameter of 3-6 mils at the small end, and 10-20 mils on the larger end. The substrate complete with holes can be fabricated in any suitable manner. When ceramic material is used, a ceramic slurry, which includes finely divided ceramic material and a vehicle, can be doctor bladed to the desired thickness, holes punched or molded, and the resultant green ceramic sheet sintered. Alternately the substrate can be molded and sintered if desired.

Figure 3:
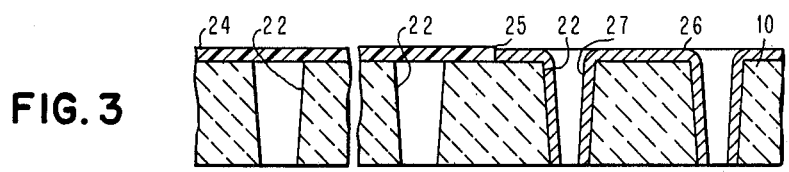
Figure 4:
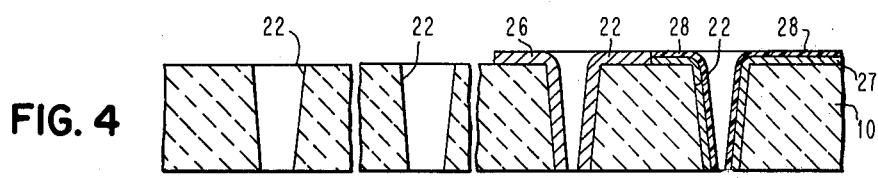
Figure 5:
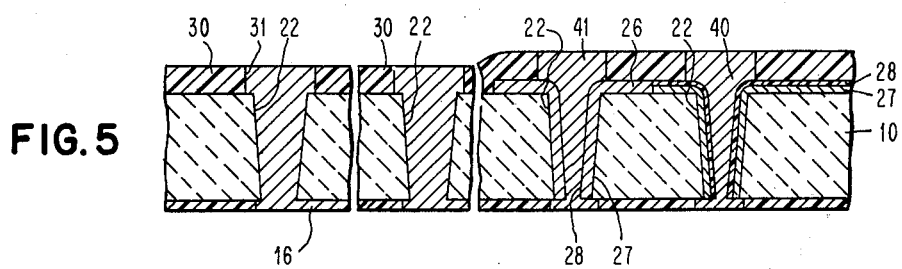

The substrate 10 will have the holes 22 formed to provide a configuration of holes underlying the device pads 20 supplying the power to the device as indicated in FIG. 1. The substrate 10 can be fabricated to any suitable size and accomodate any suitable number of devices. In general however, it is difficult to accomodate more than three semiconductor devices on a single substrate when utilizing a single level metallurgy. The configuration of holes 22 must be designed prior to punching or molding to accomodate for shrinkage of the substrate during sintering. Therefore the initial pattern in the unsintered substrate must be larger than the device pattern by the amount that the substrate will shrink during sintering. As indicated in FIG. 3 the substrate is masked with a resist layer 24 on the surface with ends of the holes with the larger tapered ends, the resist exposed and developed to leave an opening 25 over the holes in which the decoupling capacitors are to be formed. In general these openings underlie the power/ground terminals of the device after the device is in place. Layer 24 therefore covers openings 22 which will serve as simple vias for signal metallurgy lines. A thin layer of base metal 26 on the top surface and layer 27 within the holes are then deposited on the substrate that is exposed by mask 24. The base metal is preferably but not limited to either aluminum, titanium, tantalum, or copper, to a thickness on the order of a few micrometers. The deposition of the metal can be achieved by evaporation techniques, sputter deposition, or electroless plating. If the metal of layers 26 and 27 is deposited by evaporation or sputter deposition, the film that is deposited on the surface of resist 24 is removed along with that layer when it is removed. The thickness of layers 26 and 27 can be increased if so desired by electroplating. This technique which is well known and in general is achieved by making the conductive layers 26 and 27 the cathode in a plating solution. After removal of mask 24 the thickened layers 26 and 27 are anodized to form a thin dielectric layer 28 preferably having the thickness in the range of 0.25 to several millimicrons as indicated in FIG. 4. This dielectric layer 28 is formed by anodizing the metal layer in a suitable solution. The oxide so formed will depend on the nature of the initial layer. If the layers 26 and 27 are aluminum, $Al_2O_3$ is formed, if the initial layers are titanium, $TiO_2$ is formed, or if the layers are tantalum, $Ta_2O_5$ is formed. The anodized substrate can then be heated in an oxidizing atmosphere to oxidize the metal which is not well covered by the anodization process such as the presence of pinholes in the anodized oxide. If the base metal is copper, a thin oxide layer such as $SiO_2$, $Al_2O_3$ etc. is deposited on the top of the copper by sputtering or other means. As indicated in FIG. 5 a mask 30 having a relatively large thickness in the range of 3-6 mils is formed on one surface of the substrate 10. The mask 30 can be formed by prepunching a Mylar sheet having openings 31 with a larger diameter than the exposed openings of holes 22. The masking sheet 30 is then adhered to the surface of substrate 10 and the openings filled with a conductive paste, preferably copper with 3-6% zinc and/or tin combined with a suitable vehicle. The paste can be forced into openings 22 and in openings 31 of the mask by squeegee printing as for example, utilizing an apparatus and technique disclosed in U.S. Pat. No. 3,384,931. If desired the holes 22 in the substrate can be filled separately prior to applying mask 30. Alternatively, the holes 22 and 31 can be metallized by electroless plating.

Figure 6:
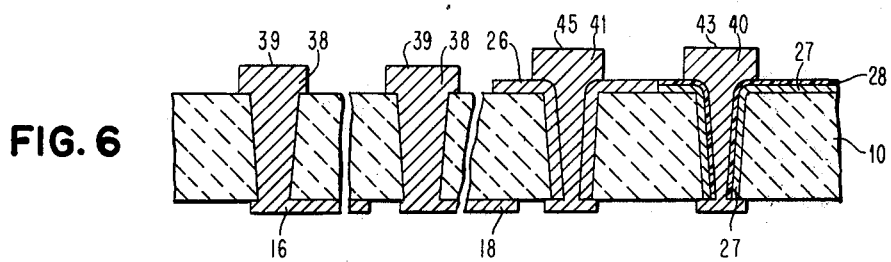

In order to make a contact to the metal layer 26, at least one of the holes 22 can be masked prior to anodization. The hole can be masked by forming a resist layer over the opening or covering it with wax. During anodization the interior surface of the masked hole will not be anodized. Subsequently when the conductive paste is inserted, as illustrated in FIG. 5, the conductive plug 41 so formed will be in direct contact with the conductive layer 27. In all of the remaining holes where decoupling capacitors are formed, the conductive plug formed by screening conductive paste in the holes will be separated from the conductive layer 26 by anodized layer 28 which is a dielectric material. The resultant structure as indicated in FIG. 6, after the masking layer 30 has been removed, is a series of capacitors where the conductive plug 40 is one plate, the conductive layer 27 is the other plate, and the dielectric layer 28 is formed of anodized layer or deposited oxide 26. The plug 41 in direct contact with layer 27, will form the ground to layer 26 which interconnects layers 27 of all the decoupling capacitors. Referring to FIG. 6 the opposite side of substrate 10 has a fan-out metallurgy pattern formed of stripes 16 and 18 as indicated in FIG. 1 which joins the signal terminals of the device to be joined to the substrate with the vias 38 which do not underlie the device. This metallurgy pattern can be formed by any suitable manner as for example, by adhering a punched masking layer to the surface of the device, forming the metallurgy stripe openings by cutting with an E-beam, and subsequently filling the openings with conductive paste. Alternately a blanket layer of metal can be deposited and a suitable pattern formed by subtractive etching which is well known in the art. Another alternative method is depositing a thin layer of metal (1000A), forming a photo-resist window pattern of the signal lines, then electro-plating metal in the window pattern, removing the photo-resist and finally dip etching to remove the initial thin metal deposit to disconnect electrically among the lines.

Figure 6A:
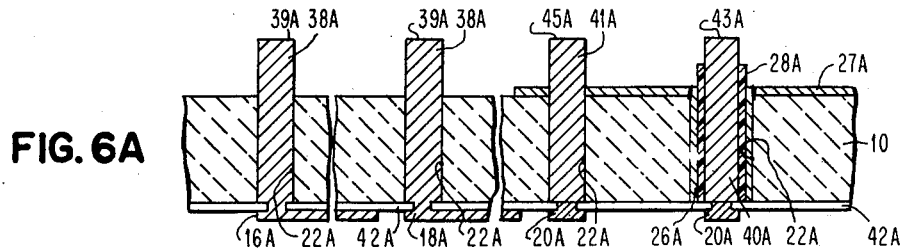
FIG. 6A illustrates an alternate embodiment of the invention.

After the conductive metal and vehicle has been screened in the holes 22 it is sintered resulting in burning off the vehicle and adhering the particles into a single solid mask. As indicated in FIG. 6 the resultant structure configuration has a plurality of signal connector terminals 39 and a plurality of power connector terminals 43 having associated therewith a decoupling capacitor positioned in close proximity to the power terminals of the semiconductor device. An alternate structure, produced by a different manner, is shown in FIG. 6A. In this embodiment the substrate 10A is provided with cylindrical holes 22A arranged in the same basic configuration as explained with regard to FIG. 2. A masking resist layer, similar to layer 24, as shown in FIG. 3, is deposited, exposed and developed to leave exposed the area surrounding the power vias and ground via. A layer 27A of metal is then deposited in the exposed area by any suitable technique. This layer 27A need not extend into the insides of the surfaces of holes 22A, although it can be so provided if desired. After the resist layer has been removed, lengths 40A of coaxial cable, each having a central core, a dielectric layer 28A, and an outer conductive metal layer 26A, are inserted into the power vias with the ends 43A extending above the surface thereby forming terminals for attachment to a supporting board or other structure. The upper ends 43A of 40A are stripped of dielectric layer 28A. Layer 26A is stripped to the level of layer 27A. The outer metal layer 26A of the coaxial cable 40A is in electrical contact with surface metal layer 27A. The dielectric layer 28A electrically isolates the central core wire of cable 40A from the outer metal layer 26A thereby forming a decoupling capacitor. A length 41A of wire is inserted into the hole 22A forming the ground terminal 45A for the capacitors. As indicated, wire 41A is in electrical contact with surface metal layer 27A. Similar lengths 38A are inserted into the signal via holes thereby forming signal terminals 39A. The device side is maintained planar, by abrading if necessary. A blanket dielectric layer 42A is formed over the device side surface, and holes etched therethrough over the pins 38A, 41A and 40A. Special care must be exercised to insure that the hole over pin 40A does not extend beyond dielectric layer 28A. A blanket multilayer of metal, such as Cr-Cu-Cr, is deposited by any suitable technique, and the metallurgy patterns 16A and 18A and contact pads 20A formed by conventional subtractive etching. This substrate can be further processed in the same manner as described with regard to the first embodiment shown in FIG. 6.

Figure 7:
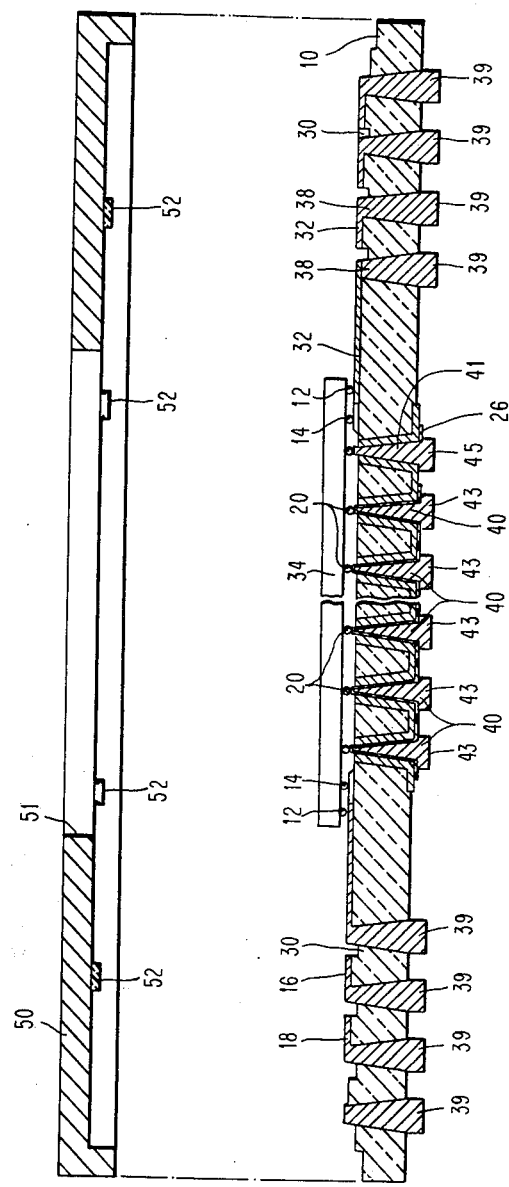
FIG. 7 is a elevational view in broken cross-section illustrating the relationship of a preferred embodiment of the substrate and an overhead ground plane in exploded relation.

As indicated in FIG. 7 notches 30 can be formed between the fan-out lines 16 and 18 which reduce the capacitive coupling by increasing the amount of air dielectric. Channels 30 can be cut with an E-beam or slurry saw and preferably are 1-1½ mils deep. If glass ceramic is used as the substrate 10, the channels can be formed by etching with the metal land acting as an etching mask.

The cross-sectional view of the substrate at this point in the process is illustrated in FIG. 7. A silicon integrated circuit chip 34 is solder bonded to the solder pads 20 of the driver circuitry and pad terminals 12 and 14 of the signal pad metallurgy. The terminals 43, forming part of the driver circuitry, and the terminals 39 forming part of the signal metallurgy are joined to terminals on a suitable wiring board or other support. Terminal 45 which is in contact with the conductive layer 27 which forms a common plate in all of the decoupling capacitors is connected to ground.

Figure 8:
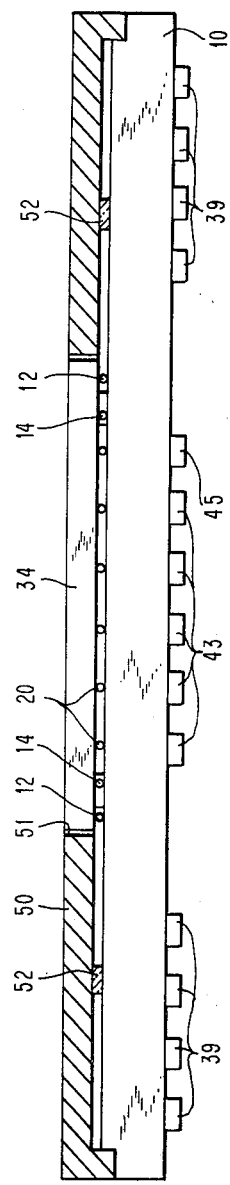
FIG. 8 is an elevational view in broken section illustrating a preferred embodiment of the package substrate and ground plane in assembled relation.

In order to reduce the inductive and capacitive couplings among the signal lines in the signal striped metallurgy on the surface of substrate 10, an overhead ground plate 50 is provided which overlies the signal stripe metallurgy 16 and 18 in closely spaced relation. The metal plate 50 has an opening 51 to receive the device 34 and is provided with insulating spacers 52 which contact the surface of the substrate or the metallurgy stripes thereby maintaining a spaced relationship. The spacers 52 of insulating material could alternately be provided on the substrate. In FIG. 8 there is illustrated the assembled overhead ground plate 50 and substrate 10.

Figure 9:
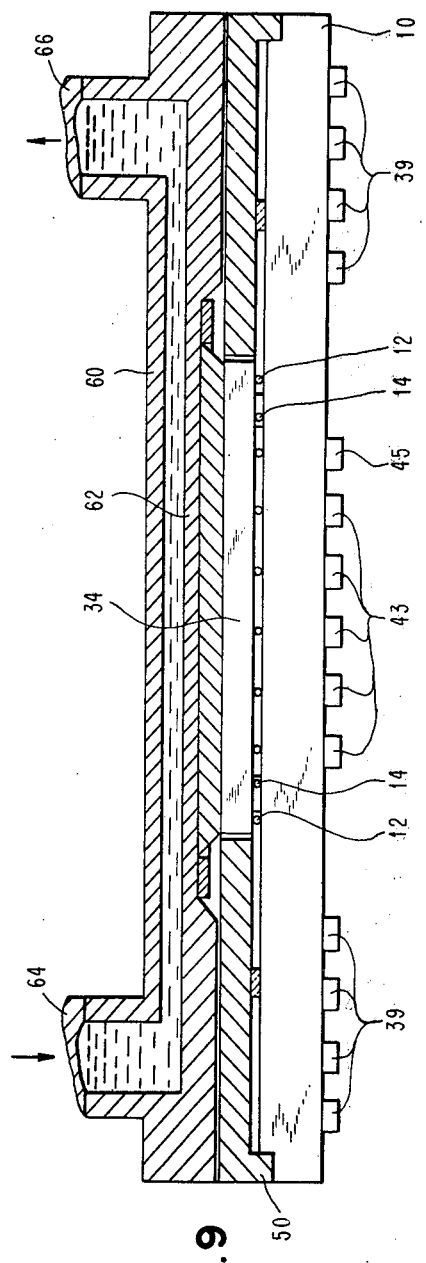
FIG. 9 is an elevational view in broken section illustrating the combination of preferred embodiments of the substrate, the overhead ground plate, and a cooling plate in assembled relation.

The plate 50 is connected to ground by suitable electrical connections. In FIG. 9 a water cooling plate 60 preferably with a serpentine water path is shown attached to the module. The cooling plate 60 can be joined to the overhead ground plate 50, or alternately the ground plate can be an integral part of the cooling plate. The central region of the cooling plate over the device 34 is secured with a layer of high thermally conductive dielectric paste material 62 to enhance the flow of heat from the device 34 to the plate 60. The thermal paste conducts heat from the device chip to the cooling plate and serves as buffer for thermal expansion/contract of the chip thus avoiding thermal stress on the silicon chip 34. The inlet 64 and outlet 66 can be connected to any suitable water source for the purpose of circulating water.

The volume surrounding the device can be simply and effectively sealed by providing a seal 51 between the flange 50 and the substrate 10, and a second seal 53 between the cooling plate 60 and ground plate 50. The seals 51 and 53 can be formed of any suitable material, such as an organic resin material or low temperature solder.

Figure 10:
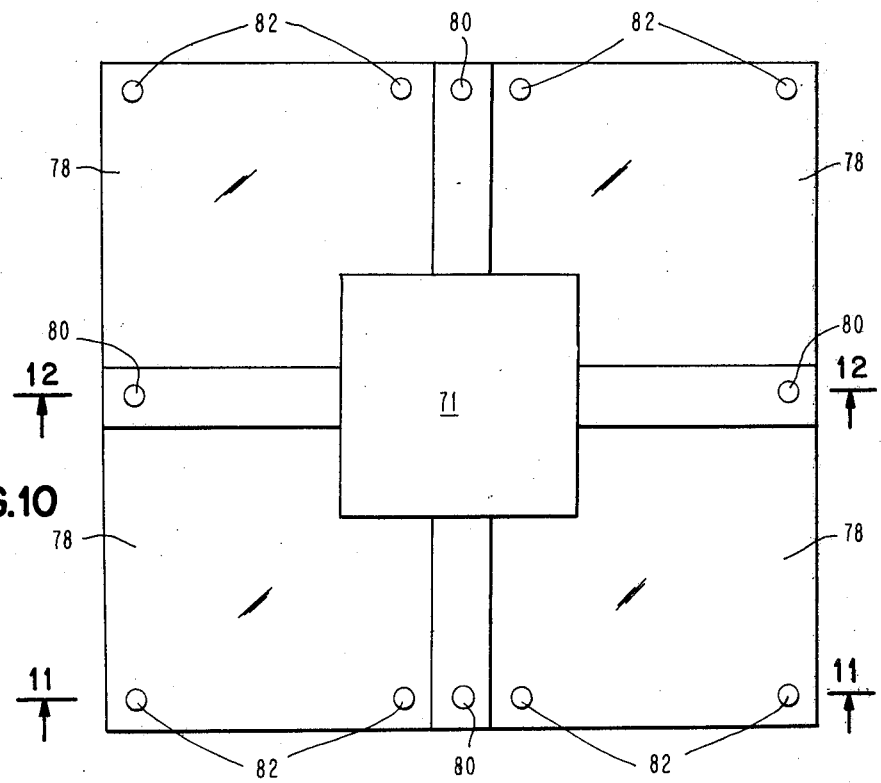
FIG. 10 is a plan view of the bottom side of another preferred specific embodiment of a ground plate of the invention.
Figure 11:
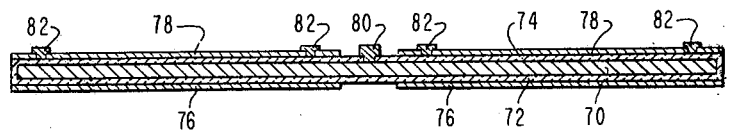
FIG. 11 is an elevational view in broken section taken on line 11—11 of FIG. 10.
Figure 12:
FIG. 12 is an elevational view in broken section taken on line 12—12 of FIG. 10.

In FIGS. 10–12 there is depicted another preferred embodiment of the overhead ground plate. In this embodiment ground plate 70 is divided into a plurality of sections. As indicated in FIG. 11 the substrate metal plate 70, provided with a hole 71 to conform to a device, has deposited thereon dielectric films 72 and 74 on the top and bottom surfaces. Metal layers 76 and 78 are formed in sectors which overlie the dielectric layers 72 and 74. A ground terminal 80 is provided in the space between the quadrants of metal layer 78 and extends through the dielectric layer 74 to the metal substrate 70. Pads 82 are formed on the metal layer 78 in direct electrical contact with metal layer. When the overhead ground plate 70 is placed on the substrate, 10 as indicated in the plan view of FIG. 1 the ground pads 80 are joined to the pads 81 on the substrate, pads 82, connected to the metal layer 78, are joined to pads 83 on substrate 10.

The above-described process sets forth the exemplary method of fabricating the large scale integrated circuit package of the invention and the structure thereof.

I claim:

1. A process for forming a high performance package for semiconductor devices having power input terminals, signal terminals, and a ground terminal, which package includes decoupling capacitors for at least the power input device terminals comprising:

forming a substrate of insulating material provided with a first set of via holes arranged in a configuration corresponding to the power input terminals on the integrated semiconductor device to be mounted, and a second set of via holes for ultimate use with metallurgy systems associated with signal input and signal output systems of the semiconductor device, forming a mask on the substrate which leaves said first set of holes and the surrounding area exposed, depositing a thin layer of a conductive metal selected from the group consisting of Al, Ta and Ti, over the said surrounding area and on the inside surfaces of said first set of holes, building up said layer of conductive metal by electroplating, removing the mask and partially anodizing said layer of conductive metal thereby forming an overlying dielectric layer, filling the first and second sets of via holes with a conductive metal, establishing electrical contact between said conductive metal underlying said dielectric layer and said ground terminal of said device, forming contact terminals on a first surface of said substrate in electrical contact with the conductive metal in said holes, forming contact pads over said first set of holes and contact pads for later connection to the signal terminals of the semiconductor device to be mounted on the second opposite side of said substrate, forming a metallurgy strip pattern joining the conductive metal in said second set of holes to contact pads for signal terminals, and solder bonding an integrated circuit semiconductor device to the contact pads over said first set of holes and the contact pads for the signal terminals.

2. The process of claim 1 wherein said substrate is formed by doctor blading a green ceramic slurry mixture to a sheet having a thickness in the range of 20 to 60 mils, drying the resultant sheet, forming holes, and sintering.

3. The process of claim 1 wherein said holes are tapered.

4. The process of claim 1 wherein said thin layer of conductive material is deposited by electroless plating techniques.

5. The process of claim 3 wherein said thin layer of conductive material is deposited by metal vacuum deposition techniques.

6. The process of claim 1 wherein said first set and said second set of holes are filled with a conductive metal by forming a paste of finely divided metal particles and an organic vehicle, forcing the paste into the sets of holes by squeege printing.

7. The process of claim 6 wherein a pre-punched mask layer is adhered to said first surface of said substrate with the pre-punched holes in said mask of a larger diameter then said hole in said substrate positioned concentrically about the first and second sets of holes in said substrate, the paste applied to the substrate to fill the sets of holes in the substrate and the pre-punched holes in said mask layer, and the mask layer removed, sintering the paste thereby forming contact terminals on said first surface of the substrate.

8. The process of claim 1 wherein electrical contact to the conductive metal layer underlying the dielectric layer and said ground terminal of said device is formed by providing an additional ground via hole in said first set of via holes which corresponds to the ground terminal of said device, initially depositing a conductive metal layer in the ground via hole that is connected to the conductive layer surrounding said first set of via holes, masking said ground via hole prior to anodizing the layer of conductive metal to form said dielectric layer to thereby prevent the interior of the hole from being anodized, and subsequently when the holes are filled with a conductive metal the metal is in direct electrical contact with said conductive metal layer underlying said dielectric layer.

9. The process of claim 1 wherein said metallurgy strip pattern is formed by depositing a blanket layer of metal over the second surface of said substrates, depositing, exposing and developing a layer of resist which defines the desired strip pattern, etching away the exposed metal layer areas.

10. The process of claim 1 wherein said metallurgy strip pattern is formed by overlying a metal mask having openings corresponding to the desired strip pattern on the second side of said substrate, and squeege printing conductive paste through the openings in said mask.

11. The process of claim 1 wherein grooves are formed in the second side of substrate between the strips of said metallurgy stripe pattern.

12. The process of claim 1 which further includes forming a metal sheet of a size to overlie said substrate, forming an opening in the metal sheet for a device positioned on said substrate, forming spacers on said metal sheet of insulating material, positioning the metal sheet in overlying position to the second surface of said substrate establishing electrical ground connection to the metal sheet, and securing the sheet to the substrate.

13. The process of claim 12 which further includes positioning and securing a water cooled plate to the substrate in overlying position relative to said metal plate and integrated circuit semiconductor device.

14. A process for forming a high performance package for semiconductor devices having power input terminals, signal terminals, and a ground terminal, which package includes decoupling capacitors for at least the power input device terminals of an integrated semiconductor device comprising forming a substrate of insulating material provided with a first set of power via holes arranged in a configuration corresponding to the power input terminals, and a ground via hole corresponding to the ground terminal of an integrated semiconductor device to be mounted, and a second set of signal via holes for ultimate use with metallurgy systems associated with signal input and output systems of the semiconductor device, forming a conductive metal layer on a first side over the area of the substrate surrounding the power via holes and the ground via hole, inserting lengths of coaxial cable into the power via holes in the substrate with the outer metal layer of the coaxial cable in electrical contact with the conductive metal layer on said first side, inserting lengths of metal wire into the ground via hole and the signal via holes, forming a blanket dielectric layer on the surface of the second opposite side, forming openings through the dielectric layer for connection to the lengths of metal wire and coaxial wire, forming a metallurgy pattern and contact pads over the dielectric layer in contact with the lengths of wire in the signal via holes, the ground via hole, and the power via holes.

15. The process of claim 14 where the holes in said substrate are cylindrical in shape.

16. The process of claim 15 wherein the lengths of coaxial wire and metal wire each have a portion which protrudes above said first surface thereby forming a terminal for connection to a supporting wiring board.

* * * * *